United States Patent [19]

Gal

[11] Patent Number: 4,609,834

[45] Date of Patent: Sep. 2, 1986

[54] INTEGRATED LOGIC CIRCUIT INCORPORATING A MODULE WHICH GENERATES A CONTROL SIGNAL THAT CANCELS SWITCHING NOISE

[75] Inventor: Laszlo V. Gal, Poway, Calif.

[73] Assignee: Burroughs Corporation, Detroit, Mich.

[21] Appl. No.: 685,497

[22] Filed: Dec. 24, 1984

[51] Int. Cl.[4] ................. H03K 17/16; H03K 19/086
[52] U.S. Cl. ..................... 307/443; 307/200 A; 307/446; 307/455; 307/520; 307/546; 307/246; 307/303
[58] Field of Search ............... 307/200 A, 200 B, 443, 307/446, 455, 520, 529, 542, 544, 546, 555–558, 246, 247 A, 254, 262, 303, 296 R; 328/57, 162; 330/149, 307

[56] References Cited

U.S. PATENT DOCUMENTS

| | | | |
|---|---|---|---|
| 3,798,559 | 3/1974 | Tomita et al. | 307/544 |
| 3,816,762 | 6/1974 | Holt, Jr. | 307/303 X |
| 3,969,637 | 7/1976 | Minami et al. | 307/542 |
| 4,437,022 | 3/1984 | Miersch et al. | 307/542 X |
| 4,477,736 | 10/1984 | Onishi | 307/443 X |
| 4,482,820 | 11/1984 | Kohsiek | 331/105 X |
| 4,508,981 | 4/1985 | Dorler et al. | 307/542 |
| 4,527,077 | 7/1985 | Higuchi et al. | 307/443 |
| 4,532,442 | 7/1985 | Black | 307/520 |

FOREIGN PATENT DOCUMENTS 0054642 6/1982 European Pat. Off. ............ 307/542

Primary Examiner—Stanley D. Miller
Assistant Examiner—D. R. Hudspeth
Attorney, Agent, or Firm—Charles J. Fassbender; Kevin R. Peterson

[57] ABSTRACT

A circuit having reduced susceptibility to noise includes a plurality of drivers coupled to a current bus; each driver receives a logic signal on a control terminal and operates to pass a large current when the logic signal is a one and pass a small current when the logic signal is a zero; the current bus has a parasitic inductance which generates a noise signal when the logic signals switch; noise on the current bus is parasitically coupled to the control terminal of each driver; and a plurality of noise reducing modules respectively couple to the control terminal of each driver and a common bus. Each module that receives a switching logic signal generates a control signal on the common bus that is similar in shape and opposite in polarity to the noise signal; and each module that does not receive a switching logic signal couples the control signal from the common bus to the control terminal to which it is connected.

14 Claims, 5 Drawing Figures

INTEGRATED LOGIC CIRCUIT INCORPORATING A MODULE WHICH GENERATES A CONTROL SIGNAL THAT CANCELS SWITCHING NOISE

BACKGROUND OF THE INVENTION

This invention relates to digital logic circuits on semiconductor chips; and more particularly, it relates to means within such circuits for reducing switching noise.

In the prior art it is common to construct over two thousand digital logic gates on a single semiconductor chip. Those gates are often interconnected on the chip to simultaneously perform several different logic functions. Each digital signal that represents a completed logic function is then sent off of the chip through a respective output driver. Usually the number of output drivers on a single chip is at least twenty.

When the logic signals to some of the output drivers switch from one state to another, switching noise is generated on the voltage buses on the chip. That noise is then coupled by parasitic resistive and capacitive elements to the remaining output drivers which at the time are not supposed to switch. However, if the noise becomes too large, it will cause glitches in the signals from the output drivers and that in turn can cause system malfunctions. Thus it is highly desirable to circumvent this noise problem.

One factor which affects the magnitude of switching noise is the speed at which the logic signals from the output drivers change state. Switching noise increases as switching speed gets faster; and one approach in the prior art to decrease switching noise was to add capacitors across the output drivers to slow down the speed at which they switched. However, such an approach is unattractive because it limits the overall performance of the chip. A primary goal of many digital circuits (e.g., digital computers) is to operate as fast as possible; and intentionally slowing down the switching speed of the output drivers directly limits from that goal.

Another approach in the prior art to reducing switching noise was to reduce the inductance of the chip's voltage buses. Part of that inductance is caused by the voltage pins on the package which encapsulates the chip; and it is reduced by providing several voltage pins on the package in parallel. However, by allocating several pins to voltage, the total number of pins that are available for carrying logic signals is reduced; and often a chip designer wants all the logic signal pins he can get. Further, other components (such as bonding wire between the chip and the package and conductive traces on the package between the bonding wire and the pins) add to the voltage bus inductance, and they remain even if several voltage pins are placed in parallel.

Accordingly, a primary object of the invention is to provide a module for use with an integrated circuit that substantially reduces the circuit's susceptibility to switching noise without slowing the circuit's switching speed and without requiring multiple parallel voltage pins.

BRIEF SUMMARY OF THE INVENTION

These objects and others are achieved by a circuit that includes a plurality of logic gates for generating and switching logic signals on respective output conductors. A plurality of output drivers have control terminals respectively coupled to the output conductors. A current bus is coupled to the plurality of output drivers. Each output driver operates to pass a large current from the bus in response to a logic one signal on its control terminal and to pass a small current in response to a logic zero. The bus has a parasitic inductance which generates a noise signal when the switching logic signals cause current on the bus to change in magnitude. A parasitic capacitive coupling between the bus and the control terminal of each output driver couples a portion of the noise signal to the control terminals. A noise reducing module couples to the control terminal of each output driver. This module generates, from the logic signals that switch, a control signal that is similar in shape and opposite in polarity to the noise signal on the bus. This module also couples the control signal to the control terminals to cancel the noise signal which they receive.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
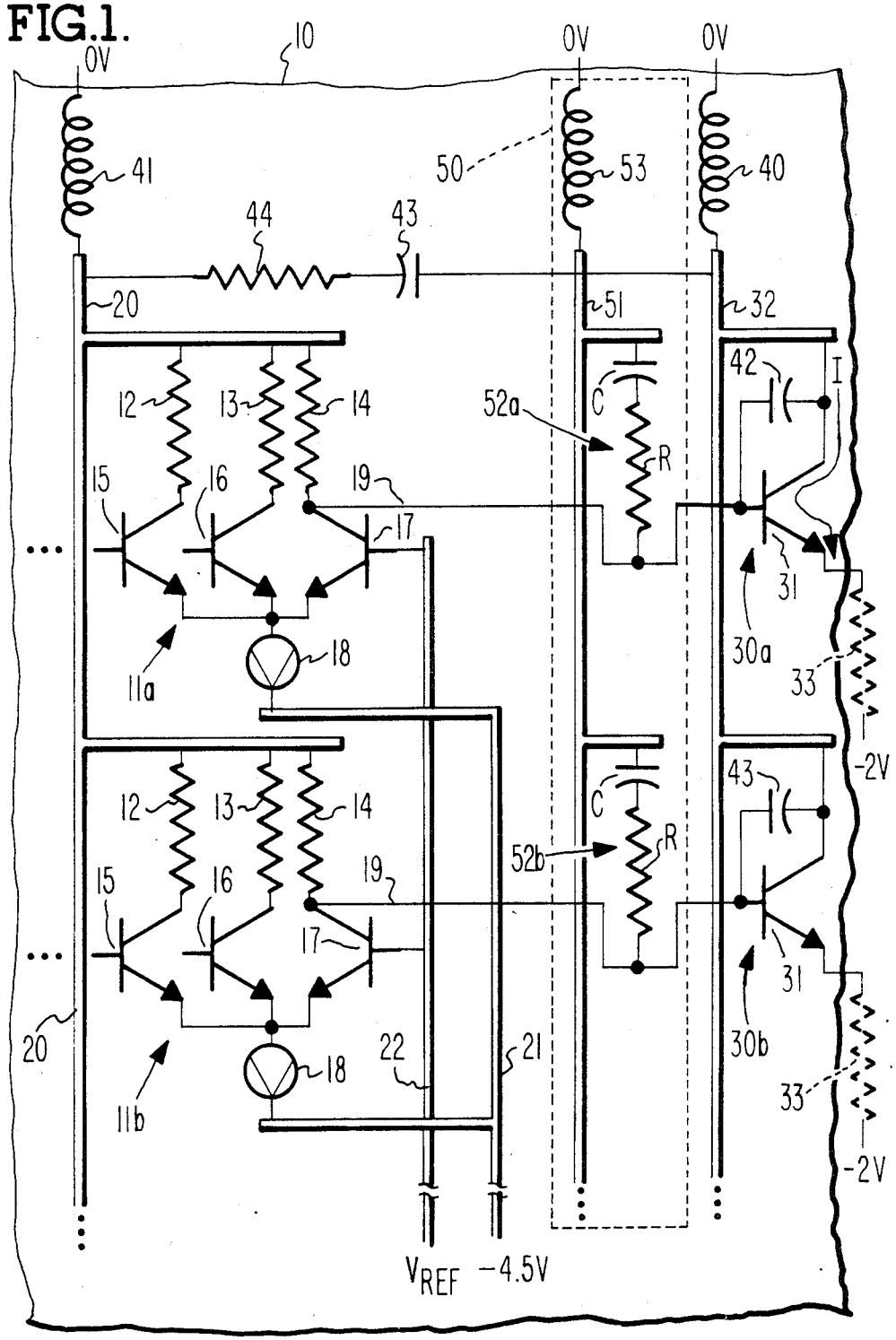
FIG. 1 is a detailed circuit diagram of one preferred embodiment of the invention.

Referring now to FIG. 1, a circuit 10 which is one preferred embodiment of the invention, will be described in detail. Included in circuit 10 is a plurality of logic gates 11a, 11b, etc. Each logic gate has three resistors 12-14, three transistors 15-17, a current source 18, and an output conductor 19. All of these components are interconnected as illustrated in FIG. 1.

A voltage bus 20 supplies zero volts to the resistors 12-14 in all of the logic gates. Another voltage bus 21 supplies minus 4.5 volts to current source 18 in all of the logic gates. And another bus 22 supplies a reference voltage to the base of transistor 17 in all of the logic gates.

In operation, logic signals are applied to the base of transistors 15 and 16. If both of those logic signals are at a low voltage level, then transistors 15 and 16 turn off and transistor 17 turns on. As a result, current from source 18 flows through resistor 14 which in turn generates a low voltage level on output conductor 19. Conversely, if transistor 15 (or transistor 16) receives a high voltage level, then transistor 15 (or transistor 16) turns on and transistor 17 turns off which in turn generates a high voltage level on an output conductor 19.

Also included in circuit 10 are a plurality of driver circuits 30a, 30b, etc. Each driver circuit has a transistor 31 which has its base coupled to output conductor 19 of a respective one of the logic gates. A voltage bus 32 supplies zero volts to the collector of transistor 31 in each of the output drivers; and the emitter of transistor 31 in each of the output drivers drives a resistive load 33 which is external to circuit 10 and is terminated in minus two volts.

In operation, transistor 31 turns on when it receives a high voltage level from output conductor 19. That in turn causes a current I to flow through transistor 31 to external load 33. Conversely, transistor 31 turns nearly off when it receives a low voltage level from output conductor 19; and that in turn decreases the current I.

Note that in circuit 10 the number of logic gates generally is much larger than the number of output drivers. Typically, several logic gates are coupled together to perform some logic function, and only the output conductor 19 of the last gate goes to an output driver. In FIG. 1 this is indicated by a sequence of three dots.

Further included in circuit 10 are several parasitic components. One such component is a parasitic inductor 40 in voltage bus 32. When circuit 10 is constructed as an integrated circuit on a single semiconductor chip, inductor 40 occurs due to (1) the pins on the package which holds the chip, (2) the discrete bonding wires that carry voltage between the chip and the package, and (3) the printed wire in the package between the bonding wire and the pins. Voltage bus 20 also includes a similar parasitic inductor 41. These inductors typically are 0.4–2 nano-henrys.

Another parasitic component in circuit 10 is capacitor 42 which is coupled between the base and collector of transistor 31 in each of the output drivers. This capacitance arises primarily due to the P-N junction between the transistor's base and collector. Typically, capacitor 42 is 0.4–1 picofarads.

Also, a parasitic capacitor 43 and resistor 44 are coupled in series between voltage buses 20 and 32. These parasitic components arise primarily due to a substrate coupling between transistor 31 on bus 32 and resistors 12–14 on bus 20. When the total number of logic gates and output drivers in circuit 10 respectively are 2500 and 50, capacitor 43 typically is 100–200 picofarads and resistor 44 typically is 5–10 ohms.

Due to the presence of the parasitic components 40–44, any switching of the logic signals on some of the output conductors 19 causes noise to be generated on the remaining output conductors that carry logic signals which are not switching. Those conductors 19 that carry logic signals which are not switching and on which noise is generated are herein called noisy conductors, and those output drivers to which the noisy conductors couple are herein called noisy drivers.

If the noise on a noisy conductor is transmitted through a noisy driver, system malfunctions will occur. To overcome this problem, circuit 10 includes a noise reducing module 50. It is coupled to the base of each of the transistors 31 and it operates to reduce the noise that is caused by the parasitic components on the base of the transistors 31.

Included in module 50 is a bus 51 and a plurality of capacitor-resistor pairs 51a, 52b, etc. In each capacitor-resistor pair, the capacitor C and resistor R are connected in series; one terminal capacitor C is coupled to bus 51; and one terminal or resistor R is coupled to an output conductor 19 of a respective logic gate. Bus 51 carries zero volts, and it has a parasitic inductor 53 that is similar to inductors 40 and 41.

Figure 2:
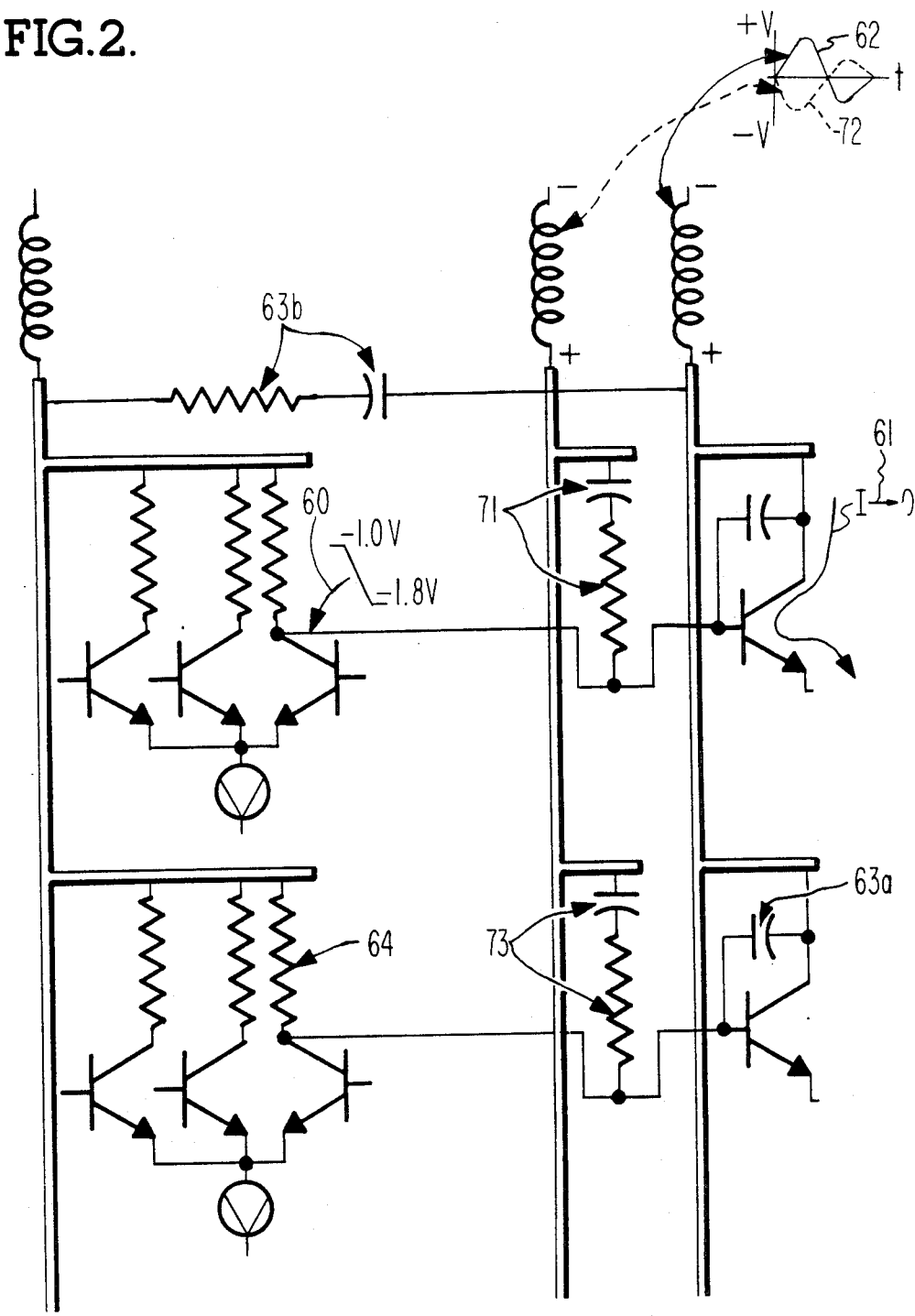
FIG. 2 is a modification of FIG. 1 which shows the sequence by which the FIG. 1 circuit operates.

To understand the manner by which circuit 50 operates to reduce noise, reference should now be made to FIG. 2. That figure shows all of the circuitry of FIG. 1; and in addition, it contains reference numerals 60, 61, 62, 63a, 63b, and 64 which indicate the sequence by which noise is induced on the noisy output conductors 19. Also, it contains reference numerals 71, 72, and 73 which indicate the sequence by which that noise is compensated for by module 50.

Considering first reference numeral 60, it shows a high-to-low voltage transition occurring on output conductor 19 of logic gate 11a. In response thereto, reference numeral 61 shows that current I through driver 30a reduces to nearly zero. Due to this change in current through inductor 40, a noise voltage 62 is induced on bus 32. That noise voltage as reference numeral 62 shows consists essentially of two concatenated pulses, the first of which is positive and the second of which is negative.

Reference numeral 63a indicates that noise voltage 62 is coupled to the base of the noisy driver 30b by parasitic capacitor 43; and reference numeral 63b indicates that at the same time, the noise voltage 62 is coupled to bus 20 by means of parasitic components 43 and 44. Then, reference numeral 64 indicates that resistor 14 couples the noise from bus 20 to the base of the noisy drivers.

Consider now reference numerals 71, 72, and 73. Reference numeral 71 indicates that in response to the high-to-low voltage transition 60, the series resistor-capacitor pair 52a in conjunction with the parasitic inductor 53 operate to generate a control signal 72 on bus 51. Control signal 72 is similar in shape and opposite in polarity to the noise signal 62. Reference numeral 73 then indicates that the control signal 72 is coupled by the resistor-capacitor pair 52b to the base of the noisy driver 30b. Since the waveforms 62 and 72 are nearly the opposite of each other, the noise signal on the base of the noisy driver is substantially reduced.

If the voltage transition 60 is from a low voltage to a high voltage (rather than from a high voltage to a low voltage), then the current change 61 through output driver 30a increases from nearly zero to some value I. This current change also occurs through inductor 40 which in turn produces a noise voltage on bus 32 that is similar in shape but opposite in polarity to the noise voltage 62. That is, the noise voltage looks like waveform 72. Under such conditions, the control signal which module 50 generates on bus 51 is shaped like waveform 62. Thus the control signal on bus 51 and the noise signal on bus 32 as before are nearly the opposite of each other, and so the noise on the base of the noisy drivers is again substantially reduced.

Similarly, if the logic signals on some of the output conductors 19 switch in one direction while at the same time the logic signals on other output conductors switch in an opposite direction, then the noise voltage that is induced on bus 32 looks like waveform 62 if the majority of the logic signals switch from high to low and it looks like waveform 72 if the majority of the logic signals switch from low to high. Conversely, the control signal that is generated by module 50 on bus 51 looks like waveform 72 if the majority of the logic signals switch from high to low and it looks like waveform 62 if the majority of the logic signals switch from low to high.

Figure 3:
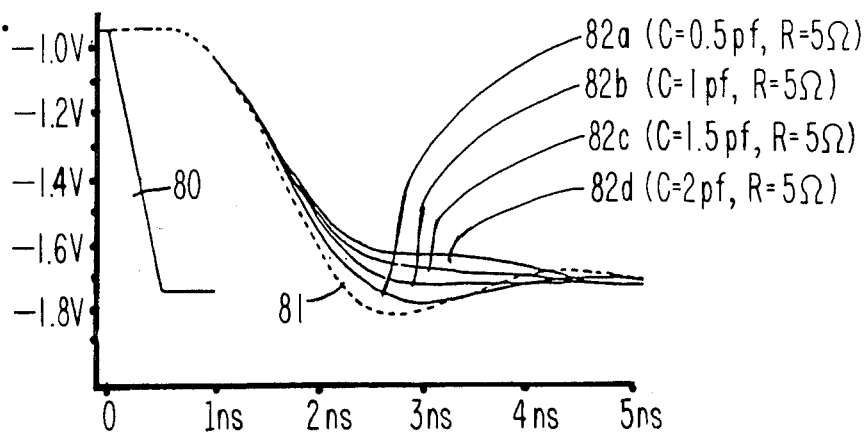
FIGS. 3, 4, and 5 are graphs that were generated by a computer simulation of the FIG. 1 circuit and which further illustrate its operation.
Figure 4:
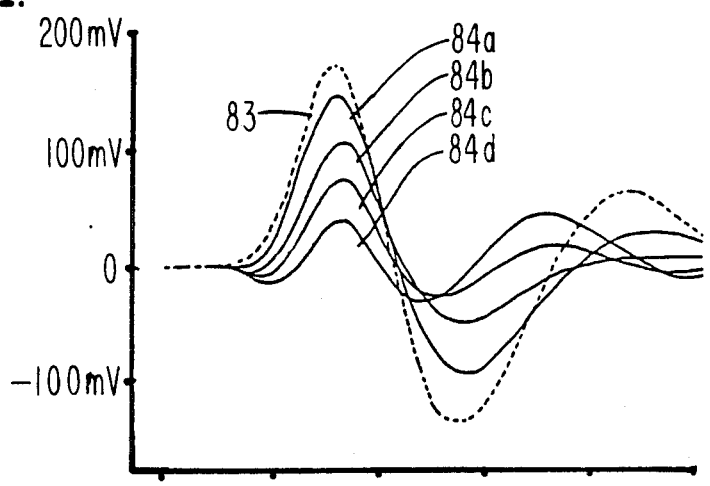
Figure 5:
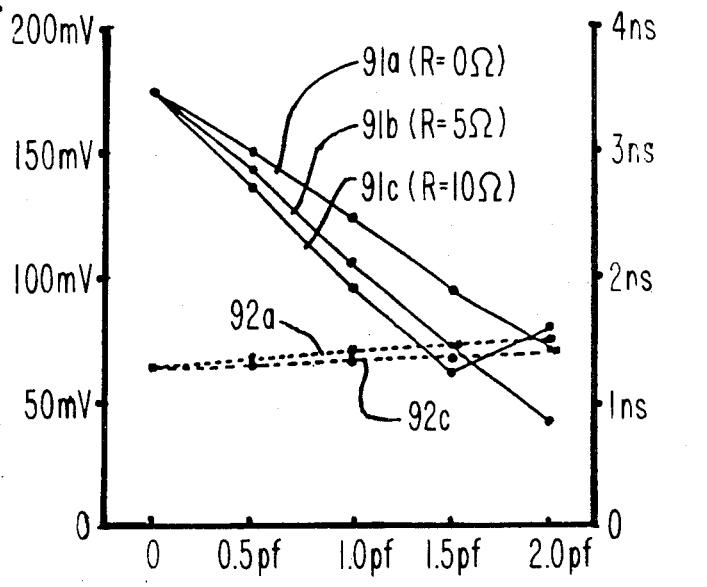

Turning now to FIGS. 3, 4, and 5, the results of a computer simulation of the FIG. 1 circuit will be described. In this simulation, the FIG. 1 circuit had two thousand five hundred logic gates, had sixty output drivers, and logic signals on fifty of the output conductors 19 all switched from high to low at the same time. This simulation was performed on a well-known circuit simulation program called SPICE. In running this program, the following parameters were used:

TABLE 1

| Component Parameters of FIG. 1 | |
|---|---|
| Resistors 12, 13, and 14 | 260 Ohm |
| Resistor 33 | 50 Ohm |
| Resistor 44 | 5.6 Ohm |
| Resistor R | 0, 5, 10 Ohm |
| Capacitor C | 0, 0.5, 1.0, 1.5, 2.0 pF |
| Capacitor 42 | .6 pF |
| Capacitor 43 | 110 pF |
| Inductor 40 | .4 nH |
| Inductor 41 | .8 nH |
| Inductor 53 | 2 nH |

TABLE 2

| Electrical Parameters of FIG. 1 Transistors | | |
|---|---|---|
| | $T_{15}, T_{16}, T_{17}$ | $T_{31}$ |
| Saturation Current (Amp) | $.94 \times 10^{-16}$ | $3.4 \times 10^{-16}$ |
| Ideal max forward beta | 82 | 82 |
| Collector Resistance (Ohm) | 86 | 8 |
| Base Resistance (Ohm) | 423 | 30 |
| Emitter Resistance (Ohm) | 3.4 | 1 |
| Base-Emitter Capacitance (pF) | 0.03 | .31 |
| Base-Collector Capacitance (pF) | 0.08 | .60 |
| Collector-Substrate Cap. (pF) | 0.39 | 2.2 |
| Forward transit time (ps) | 25 | 25 |
| Reverse transit time (ps) | 250 | 250 |

In FIG. 3, nanoseconds are plotted on the horizontal axis, and voltas are plotted on the vertical axis. Waveform 80 shows a high to low logic signal transition that occurs on some of the output conductors 19, and a waveform 81 shows the voltage that occurs on the output drivers 30a that receive waveform 80 as their input under the condition where no noise compensating module 50 is used. By comparison, waveforms 82a-82d show the voltage from the output drivers 30a that receive waveform 80 as their input under the condition where resistor R in the noise compensating module 50 is five ohms and the capacitor C has several different values. Curve 82a occurs when C is 0.5 picofarads; curve 82b occurs when C is 1.0 picofarads; curve 82c occurs when C is 1.5 picofarads; and curve 82d occurs when C is 2.0 picofarads.

Similarly, in FIG. 4 a curve 83 shows the noise voltage that occurs on the noisy output conductors 19 under the condition where no noise compensating module 50 is used; while another set of curves 84a-84d shows the noise that occurs on the noisy output conductors 19 under the condition where R is five ohms and different values of capacitance C are used. Curve 82a occurs when C is 0.5 picofarads; curve 84b occurs when C is 1.0 picofarads; curve 83c occurs when C is 1.5 picofarads; and curve 84d occurs when C is 2.0 picofarads.

Inspection of FIG. 4 shows that as the capacitance C is increased, the magnitude of the noise signal that occurs on the noisy output conductors 19 decreases. At the same time, inspection of FIG. 3 shows that this reduction in noise is achieved with essentially no increase in the switching time of the output driver. Using the criterion that a logic gate is considered to have switched when its output signal reaches its midpoint, FIG. 3 shows that less than 0.25 nanosecond is added to the switching speed of the output driver.

Next, referring to FIG. 5, additional simulation results of the FIG. 1 circuit will be described. In FIG. 5, curves 91a, 91b, and 91c show the peak amplitude of the noise that occurs on the noisy output conductors 19 for various values of both the resistor R and capacitor C in the noise reducing module 50. The peak amplitude of the noise is plotted on the lefthand vertical axis in millivolts. Curve 91a occurs when the resistance R is zero ohms; curve 91b occurs when the resistor R is five ohms; and curve 91c occurs when the resistance R is ten ohms. For all of these curves, the capacitance C is plotted on the horizontal axis in picofarads.

Also in FIG. 5, curves 92a and 92c show the propagation delay that occurs through a driver that receives a switching logic signal under the condition where the resistor R and capacitor C of the noise reducing module having various values. That propagation delay is plotted in nanoseconds on the right-hand vertical axis. Curve 92a occurs when the resistor R is zero ohms; curve 92c occurs when the resistor R is ten ohms; and for all of these curves, capacitance C is again plotted on the horizontal axis.

One preferred embodiment of the invention has now been described in detail. In addition, however, many changes and modifications can be made to this embodiment without departing from the nature and spirit of the invention. For example, any number of logic gates 11a, 11b, etc. and output drivers 30a, 30b, etc. may be included in the FIG. 1 circuit. Preferably, however, they each number at least twenty since the switching noise which module 50 compensates for becomes more severe as the number of logic gates and output drivers increases.

Also in FIG. 1, many changes may be made to the details of the circuitry which make up the logic gates and output drivers. One such change is to make each of the transistors 15, 16, 17, and 31 PNP transistors and reverse the direction of current through current source 18. Also, the logic gates and output drivers may be constructed of MOS transistors.

In addition, as FIG. 5 shows, a fairly wide range of values can be used for the resistor R and capacitor C in the noise reducing module 50. Preferably, capacitor C ranges from 0.5 to 10.0 picofarads and the resistor R ranges from zero to twenty ohms.

Accordingly, since many such changes may be made, it is to be understood that the invention is not limited to that detailed embodiment of FIG. 1 but is defined by the appended claims.

What is claimed is:

1. A circuit having reduced susceptibility to switching noise including: a plurality of logic gate means for generating and switching logic signals on respective output conductors; a plurality of driver means having control terminals respectively coupled to said output conductors; a current bus coupled to said plurality of driver means; each driver means operating to pass a large current from said bus in response to a logic one signal on its control terminal and to pass a small current in response to a logic zero; said bus having a parasitic inductance which generates a noise signal when said switching logic signals cause current on said bus to change in magnitude; a parasitic capacitive coupling from said bus to the control terminal of each driver means which couples a portion of said noise signal on said bus to the control terminals; and a noise reducing module coupled to the control terminal of each driver means; said module including a common bus and a plurality of capacitors having one terminal coupled to the control terminal of a respective driver means and having another terminal coupled to said common bus.

2. A circuit according to claim 1 wherein said noise reducing module further includes respective resistors in series with each of said capacitors.

3. A circuit according to claim 2 wherein each resistor in said module is less than twenty ohms.

4. A circuit according to claim 1 wherein said noise reducing module further includes an inductor in series with said common bus.

5. A circuit according to claim 3 wherein said inductor in said module is less than four nanohenrys.

6. A circuit according to claim 1 wherein each capacitor in said noise reducing module is less than ten picofarads.

7. A circuit according to claim 1 wherein said circuit is integrated on a single semiconductor substrate.

8. A circuit according to claim 1 wherein the number of logic gate means is at least twenty and number of driver means is at least twenty.

9. A circuit according to claim 1 wherein said logic gate means and driver means are comprised of transistors of a type selected from the group of PNP, NPN and MOS.

10. A circuit according to claim 1 wherein said logic gates are current mode logic gates, and each driver means is a single NPN transistor.

11. A circuit having reduced susceptibility to switching noise including: a plurality of logic gate means for generating and switching logic signals on respective output conductors; a plurality of driver means having control terminals respectively coupled to said output conductors; a current bus coupled to said plurality of driver means; each driver means operating to pass a large current from said bus in response to a logic one signal on its control terminal and to pass a small current in response to a logic zero; a said bus having a parasitic inductance which generates a noise signal when said switching logic signals cause current on said bus to change in magnitude; a parasitic capacitive coupling from said bus to the control terminal of each driver means which couples a portion of said noise signal on said bus to the control terminals; and a noise reducing means coupled to the control terminal of each driver means for generating, from the logic signals that switch, a control signal that is similar in shape and opposite in polarity to said noise signal on said bus, and for coupling said control signal to said control terminals to cancel the noise signal which is parasitically coupled thereto.

12. A circuit according to claim 11 wherein said noise reducing means generates said control signal as two concatenated pulses one of which is positive and the other of which is negative.

13. A method of compensating for noise in a circuit of the type that is comprised of a plurality of drivers coupled to a current bus, each driver including a control terminal for receiving a logic signal and also including a means for passing a large current from said current bus when said logic signal is a one and a small current when said logic signal is a zero, said current bus having a means which generates a noise signal when said logic signals switch, and a parasitic coupling of said noise from said current bus to the control terminal of each driver; said method including the steps of:

generating on a common bus in response to each logic signal that switches, a control signal that is similar in shape and opposite in polarity to said noise signal; and coupling said control signal from said common bus to the control terminals on which logic signals do not switch.

14. A method according to claim 13 wherein said control signal is generated as two concatenated pulses one of which is positive and the other of which is negative.

* * * * *